US008534875B1

(12) United States Patent
Zhang et al.

(10) Patent No.: US 8,534,875 B1
(45) Date of Patent: Sep. 17, 2013

(54) CUSTOMIZABLE HEAT SINK FORMED OF SHEET MATERIAL FOR A LAMP

(76) Inventors: Shiyong Zhang, Acton, MA (US); Yichong Zeng, Chelmsford, MA (US)

(*) Notice: Subject to any disclaimer, the term of this patent is extended or adjusted under 35 U.S.C. 154(b) by 6 days.

(21) Appl. No.: 13/463,411

(22) Filed: May 3, 2012

(51) Int. Cl.
*F21V 29/00* (2006.01)

(52) U.S. Cl.
USPC .............................................. 362/294; 313/46

(58) Field of Classification Search
USPC ................................ 362/294; 313/46; 257/98
See application file for complete search history.

(56) References Cited

U.S. PATENT DOCUMENTS

| | | | |
|---|---|---|---|
| 6,511,209 B1 * | 1/2003 | Chiang | 362/294 |
| 7,458,706 B1 * | 12/2008 | Liu et al. | 362/373 |
| 7,784,973 B2 * | 8/2010 | Zhang et al. | 362/294 |
| 7,878,686 B2 | 2/2011 | Suehiro et al. | |
| 7,932,532 B2 | 4/2011 | Pickard et al. | |
| 8,066,410 B2 * | 11/2011 | Booth et al. | 362/294 |
| 8,083,374 B2 * | 12/2011 | Mo et al. | 362/249.02 |
| 8,083,375 B2 * | 12/2011 | Kong | 362/249.02 |
| 8,100,562 B2 * | 1/2012 | Gluszczak et al. | 362/294 |
| 8,109,654 B2 * | 2/2012 | Mo | 362/249.02 |
| 8,123,382 B2 * | 2/2012 | Patrick et al. | 362/294 |
| 8,182,116 B2 * | 5/2012 | Zhang et al. | 362/294 |
| 8,235,549 B2 * | 8/2012 | Gingrich et al. | 362/249.02 |
| D667,969 S * | 9/2012 | Rioux et al. | D26/2 |
| 8,303,137 B2 * | 11/2012 | Paik et al. | 362/294 |
| 2008/0158887 A1 * | 7/2008 | Zhu et al. | 362/294 |
| 2008/0310167 A1 | 12/2008 | Zaderej et al. | |
| 2009/0296403 A1 * | 12/2009 | Zhang et al. | 362/294 |
| 2010/0133578 A1 * | 6/2010 | Pickard et al. | 257/99 |
| 2010/0208473 A1 * | 8/2010 | Sakai et al. | 362/373 |
| 2011/0074265 A1 | 3/2011 | Van De Ven et al. | |
| 2011/0242816 A1 | 10/2011 | Chowdhury et al. | |
| 2012/0236567 A1 * | 9/2012 | Hung et al. | 362/294 |
| 2012/0248961 A1 * | 10/2012 | Lai | 313/46 |

FOREIGN PATENT DOCUMENTS

| | | |
|---|---|---|
| EP | 2256403 A2 | 12/2010 |
| GB | 2479423 | 10/2011 |
| WO | 2011029724 A1 | 3/2011 |
| WO | 2012007403 A1 | 1/2012 |

OTHER PUBLICATIONS

Standard Lamp Envelope Profiles for PAR38 (PAR121) (Fig. C78. 21-238), PAR30 (PAR95) long neck (Fig. C78.21-275), and PAR30 (PAR95) short neck (Fig. C78.21-238) on pp. 19, 29, 30, respectively, pub'd(c) 2003 Amer. Natl. Std. Lighting Group—NEMA (3 pages).
Co-inventors' co-pending U.S. Appl. No. 13/422,172, filed Mar. 16, 2012, assigned to Osram Sylvania Inc.

* cited by examiner

*Primary Examiner* — Mary Ellen Bowman
(74) *Attorney, Agent, or Firm* — Edward S. Podszus

(57) ABSTRACT

A solid state lighting device (100) including a heat sink (108) stamped from a single sheet (200). The heat sink (108) features a base portion (111) including a central light module receiving region (114) configured to receive a light module (102), a first set of arms (116) extending generally radially outwardly from a perimeter (P) of the base (111), a first set of transverse members (118) intersecting with the first set of arms (116), a first set of air flow apertures (120) defined by the base portion (111), the arms (116), and the transverse members (118), and a first set of radiating plates (122) having adjacent radiating plates separated by gaps. Each one of the radiating plates (122) is bent outwardly and extends transversely from a front face of a first arm (116) or first transverse member (118).

15 Claims, 11 Drawing Sheets

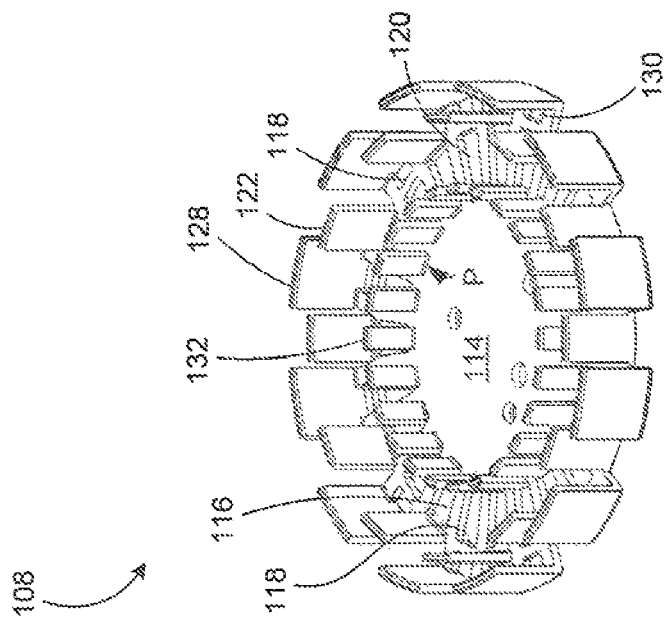
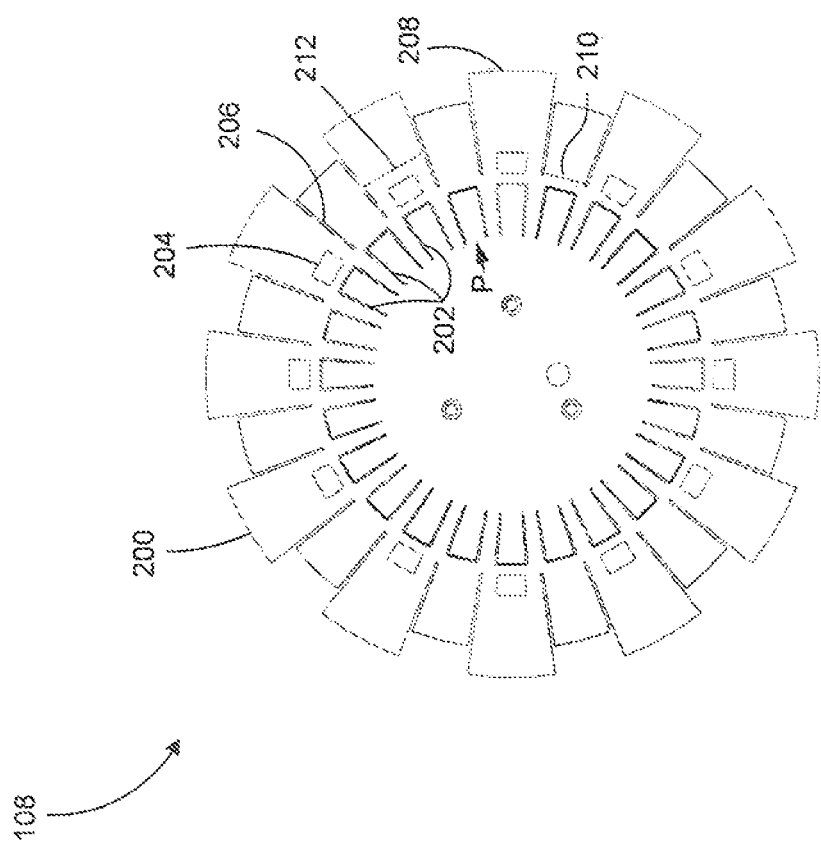
FIG. 11
FIG. 10

US 8,534,875 B1

CUSTOMIZABLE HEAT SINK FORMED OF SHEET MATERIAL FOR A LAMP

CROSS-REFERENCE TO RELATED APPLICATIONS

This application is related to U.S. patent Ser. Nos. 29/395,473 and 29/395,476, both of which are filed Jun. 27, 2011.

FIELD

The present disclosure relates generally to heat sinks, and, more particularly, to a heat sink assembly for solid-state light sources.

BACKGROUND

Solid-state lighting may include one or more LEDs as a source of illumination and provide numerous benefits including, but not limited, increased efficiency and lifespan. Similar to other types of lamps, an LED lamp emits energy in the form of radiant energy and heat. The heat generated by the lamp can cause problems (such as, but not limited to, reduced lifespan and reduced lumen output). As such, proper management of thermal energy within an LED lamp may result in improved life, decrease package size, and in some cases, improve lumen output. An additional benefit of removing thermal energy from the lamp is that the lamp can be operated in a higher ambient temperature environment without compromising life or performance of the lamp.

In order to manage thermal energy, heat sinks are often used. One example of a prior art cast heat sink 10 application for LED lamps is generally described in Applicants' Assignee's co-pending U.S. patent application Ser. No. 13/422,172 filed Mar. 16, 2012 and generally illustrated in FIG. 1, which is available from Osram Sylvania, Inc. (the assignee of the present disclosure). Other examples of heat sinks are described in U.S. Pat. No. 7,932,532 (Pickard), WO2011/029724 (Hoetzl), U.S. Patent Pub. No. 2011/0074265 (Van de Ven), UK GB2479423 (Endelberts), EP2256403 (Sakai), U.S. Patent Pub. No. 2011/0242816 (Chowdhury), U.S. Pat. No. 7,878,686 (Suchiro), PCT WO2012/007403 (Breidenassel), and U.S. Patent Pub. No. 2008/0310167 (Zaderej).

BRIEF DESCRIPTION OF THE DRAWINGS

Reference should be made to the following detailed description which should be read in conjunction with the following figures, wherein like numerals represent like parts:

FIGS. 10 and 11 illustrate one embodiment of a sheet of material prior to and after the heat sink being formed;

Figure 1:
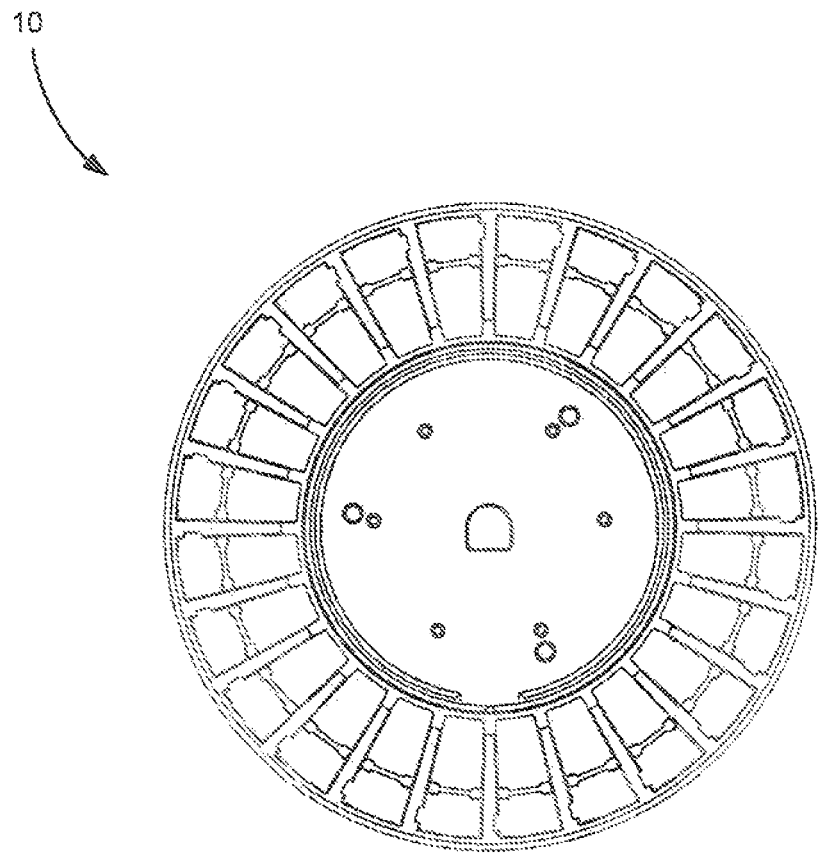
FIG. 1 illustrates a top plan view at an LED module-receiving region of a prior art die cast heat sink.

For a thorough understanding of the present disclosure, reference should be made to the following detailed description, including the appended claims, in connection with the above-described drawings. Although the present disclosure is described in connection with exemplary embodiments, the disclosure is not intended to be limited to the specific forms set forth herein. It is understood that various omissions and substitutions of equivalents are contemplated as circumstances may suggest or render expedient. Also, it should be understood that the phraseology and terminology used herein is for the purpose of description and should not be regarded as limiting.

DETAILED DESCRIPTION

By way of a brief overview, one embodiment of the present disclosure features a heat sink having improved thermal dissipation performance, reduced weight, and reduced manufacturing costs. The heat sink can be used in conjunction with at least one light emitting diode (LED) and an electrical connector to form a LED lamp assembly. As explained herein, the heat sink is stamped from a single sheet of thermally conductive material and includes a central light module receiving region configured to receive a light module, a first set of first arms extending generally radially outwardly from a perimeter of the light module receiving region, a first set of first transverse members intersecting with the first set of arms, a first set of first air flow apertures defined by the base portion, the first set of transverse members, and the first set of arms, and a first set of first radiating plates having adjacent radiating plates separated by gaps thereby permitting airflow between the adjacent pairs. Each one of the first set of radiating plates is bent outwardly and extends transversely from a front face of a respective first transverse member or first arm.

As may be appreciated, some of the significant challenges in designing a heat sink include making the heat sink as light weight as possible, low cost, high thermal performance, and aesthetically pleasing appearance. The maximum overall size and shape of a heat sink may be dictated by the desired application (e.g., as set by the American National Standards Institute, ANSI, profiles). For example, a parabolic aluminized reflector lamp (also PAR light, PAR can, or simply PAR) is a widely used commercial, residential, and transportation lamp. PAR lights are generally available in different standard sizes (e.g., but not limited to, PAR16, PAR20, PAR30, PAR36, PAR38, PAR46, PAR56, PAR64, and the like). Generally the higher the numerical designation, which refers to ⅛" increments in standard diameter, the larger the overall physical size, the lumen output, and the heat output that needs to be dissipated. The heat sink needs to be designed to not only fit within the maximum overall size/shape parameters of the standard, but also needs to dissipate enough heat to allow the electrical components (such as, but not limited to, LEDs, driver circuitry, and the like) to properly function. The weight of the heat sink may become a concern to customers since most existing light fixtures are originally designed for much lighter traditional incandescent lights. Exceeding the weight limitations of the light fixture may lead to reliability issues and/or inconvenience of handling in re-lamping. Additionally, a heavier heat sink often requires more material, thereby increasing the cost of the lamp and also increasing product shipping and handling costs.

As discussed herein, the unique structure and manufacturing of a heat sink consistent with the present disclosure increases the air flow across the heat sink, thereby making the surface area of the heat sink significantly more thermally efficient than a die cast heat sink. In addition, many sheet materials have a higher thermal conductivity compared to die cast materials. For example, sheet metal aluminum has a thermal conductivity of about 200 W/m-K whereas die cast aluminum has a thermal conductivity of about 98 W/m-K. Thermal measurements were made using a PAR38 lamp having a heat sink consistent with the present disclosure and a PAR38 lamp having a die cast heat sink. In particular, both lamps used a 10 W light source, the same thermal interface material, the same LED inputs, and all measurements were made in a 25° C. environment. The results of these measurements are illustrated in TABLE 1 below.

TABLE 1

| | Thermal Efficiency | Heat Sink Weight | Weight Reduction | Heat Sink Surface Area | Surface Area Reduction |
|---|---|---|---|---|---|
| PAR38 lamp with die cast heat sink, 10 W | ~95% | 396 g | Base, 0% | 898 cm$^2$ | Base, 0% |
| PAR38 lamp with sheet metal heat sink, 10 W | ~95% | 106 g | 73.2% | 541 cm$^2$ | 39.8% |

A heat sink consistent with the present disclosure may considerably reduce the weight and cost, while still achieving the same or better thermal performance, compared to cast or extruded heat sinks. More specifically, because the heat sink is stamped from a single sheet of thermally conductive material, the heat sink is much lighter than a cast (e.g., die cast) heat sink and does not have the bulky material that a die cast heat sink has in order to achieve the same form factor. As a result, a heat sink consistent with the present disclosure has a significantly reduced weight and size (e.g., volume) as well as material costs. The reduced weight and size (e.g., volume) of a heat sink consistent with the present disclosure not only reduces the costs of the heat sink, but also provides more flexibility in light design for better product appearance, better system performance, and allows the heat sink to work in some weight-limited applications.

In addition, the tooling of sheet metal forming processes is generally significantly less expensive compared to casting processes. For example, the method of manufacturing a heat sink consistent with the present disclosure may allow for multiple size heat sinks to be easily manufactured using the same general manufacturing process. As discussed herein, the process for manufacturing a PAR38 heat sink can be easily changed to a PAR30 (or even a PAR20 heat sink) by shearing one or more external rows/rings from a common sheet metal blank. As may therefore be appreciated, the costs of manufacturing a heat sink consistent with the present disclosure may be spread out over multiple products, thereby further reducing the manufacturing costs. In contrast, different size cast heat sinks require separate, expensive, dedicated mold tools.

Figure 2:
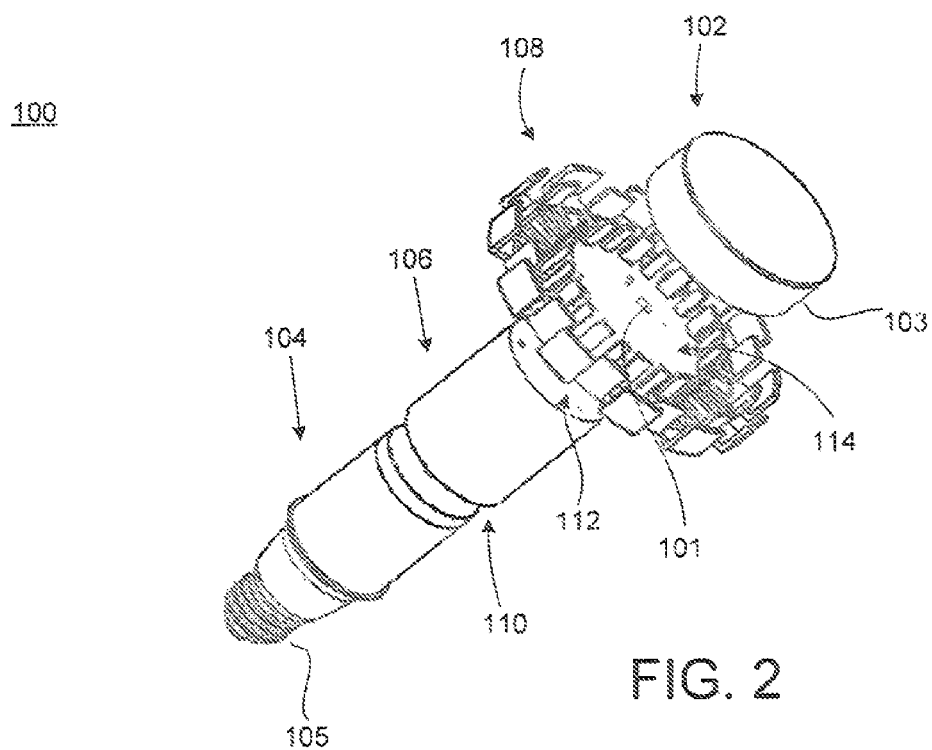
FIG. 2 illustrates an exploded view of one embodiment of a light system consistent with the present disclosure.
Figure 3:
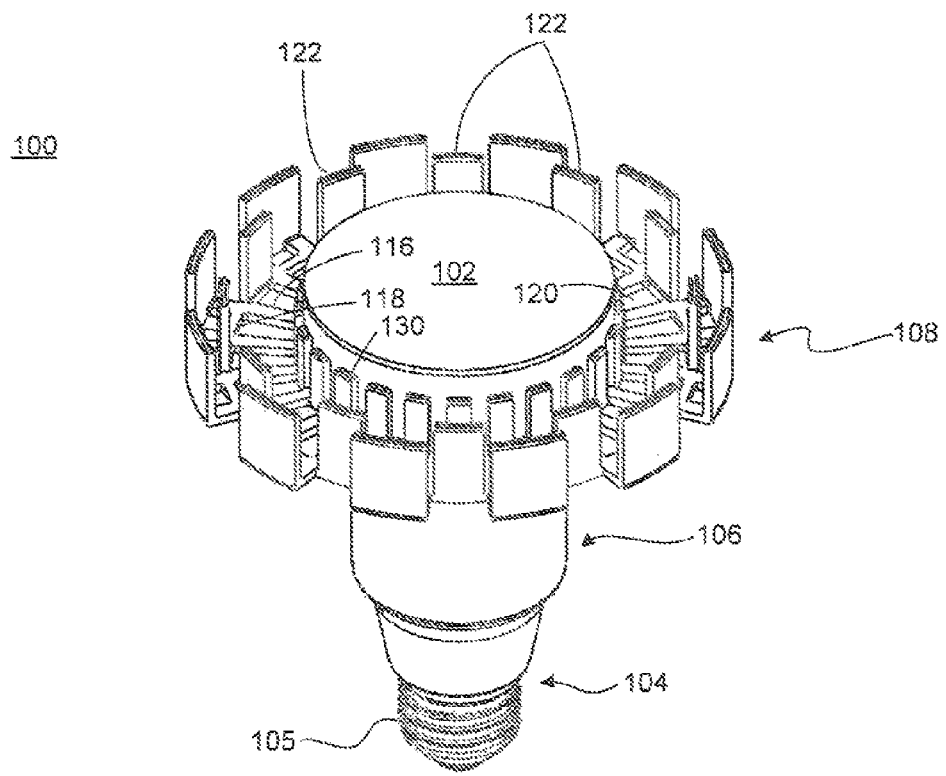
FIG. 3 illustrates an assembled view of the light system illustrated in FIG. 2.

Turning now to FIGS. 2 and 3, one embodiment of a light system 100 is generally illustrated. In particular, FIG. 2 generally illustrates an exploded view of the light system 100 and FIG. 3 generally illustrates an assembled view of a light system 100. The light system 100 features a light module 102, an electrical module 104, a driver housing 106, and a heat sink 108. The light module 102 includes at least one solid state light engine (e.g. a LED, not shown for clarity) which may be secured to a housing/body portion 103. The electrical module 104 is configured to be electrically and/or mechanically coupled to an external power supply (e.g. an electrical socket coupled to an AC or DC power source, not shown) and provide power to the light module 102 and components thereon (e.g., but not limited to, the LEDs of the light module 102), for example, through one or more passageways 101 in base 111 of the heat sink 108. According to one embodiment, the electrical module 104 includes driver circuitry (not shown for clarity) configured to convert an AC signal into a DC signal at a desired current and voltage to power the light module 102. It should be appreciated, however, that the driver circuitry may be located anywhere within the light system 100 such as, but not limited to, the light module 102.

According to one embodiment, the light module 102 and electrical module 104 are configured to be selectively attached and detached with the driver housing 106 and/or heat sink 108. When the light system 100 is assembled, the light module 102 and the electrical module 104 are electrically coupled. The electrical module 104 includes an electrical connector 105 (such as, but not limited to, include an Edison screw base) configured to be electrically and/or mechanically coupled to an external power supply. While the electrical connector 105 is illustrated as an Edison screw base, it should be appreciated that the light system 100 may be used with any electrical connector 105. Additionally, it should be appreciated that the electrical connection to the power source may be separate from the mechanical connection to secure the light system 100. While the light module 102 and electrical module 104 will generally be described as being selectively attachable/detachable to the driver housing 106 and heat sink 108, the light module 102 and/or electrical module 104 may be permanently secured to the driver housing 106 and/or the heat sink 108 such that the light module 102, the electrical module 104, driver housing 106, and/or the heat sink 108 may not be removed without damaging one or more of the components.

The driver housing 106 is configured to be mounted, coupled, or otherwise secured to the heat sink 108. For example, the driver housing 106 may be secured to the heat sink 108 using one or more fasteners (such as, but not limited to, screws, bolts, rivets, threaded connection, locking connection, or the like), adhesives (such as, but not limited to, thermal adhesives or the like), welding (such as, but not limited to, spot welding, fillet welding, or the like), or any other joining technique. According to one embodiment, the driver housing 106 is configured to receive at least a portion of the electrical module 104. For example, the driver housing 106 may include a cavity having a size and shape generally corresponding to the external dimensions of the electrical module 104. It should be appreciated, however, that one or more components of the electrical module 104 may be part of the driver housing 106 rather than electrical module 104. For example, the driver circuitry may be part of the driver housing 106. To this end, the electrical module 104 and the driver housing 106 may be a single component.

The driver housing 106 is configured to either absorb thermal energy from the heat sink 108 or transfer thermal energy to the heat sink 108, depending on the application. For example, the driver circuitry may transfer thermal energy to the driver housing 106, which may in turn transfer the thermal energy to a fluid medium, such as ambient air or liquid (e.g., the surrounding atmosphere). The driver housing 106 may absorb thermal energy transferred to the heat sink 108 from the light module 102. The driver housing 106 may optionally include one or more fins or the like (not shown for clarity) to further increase the amount of thermal energy transferred to the surrounding atmosphere depending on the thermal energy requirements of the light system 100. As may be appreciated, reducing the temperature of the driver circuitry may increase the efficiency and/or lifespan of the driver circuitry.

According to one embodiment, the driver housing 106 may feature a generally cylindrical shape. For example, the driver housing 106 may be formed through deep drawing, stamping, or a pre-cut tube and may be made from a sheet material. One end of the driver housing may include an open end 110 configured to receive the electrical module 104 as generally illustrated. The second (e.g., generally opposite) end of the driver housing 106 may be open or may include a closed end (i.e., a wall) having a generally planar or flat outer surface 112 configured to engage with a portion of the heat sink 108. For example, the outer surface 112 of the driver housing 106 may abut against the bottom surface of the heat sink 108. One advantage of the present disclosure is that the surface finish of the sheet material used to make the driver housing 106 and/or the heat sink 108 may increase the thermal contact between the driver housing 106 and the heat sink 108, for example, compared to cast materials. As a result, the need for expensive post machining may be eliminated. Optionally, a thermal pad may be provided between the outer surface 112 and the heat sink 108. While the driver housing 106 is illustrated having a generally cylindrical shape, it should be appreciated that the driver housing 106 may include other shapes such as, but not limited to, tapered shapes, conical, hexagonal, rectangular, or the like.

The heat sink 108 is configured to absorb thermal energy generated by the light module 102, electrical module 104 and/or the driver circuitry and to transfer the thermal energy to a fluid medium, such as ambient air or liquid. The heat sink 108 is formed from a single sheet of thermally conductive material such as, but not limited to, aluminum, steel, copper, or the like. As noted above, sheet metal aluminum has a thermal conductivity of about 200 W/m-K, whereas die cast aluminum has a thermal conductivity of about 98 W/m-K. As such, a heat sink 108 formed from sheet metal may have a thermal conductivity which is over 100% greater than the thermal conductivity of a cast metal heat sink.

Figure 4:
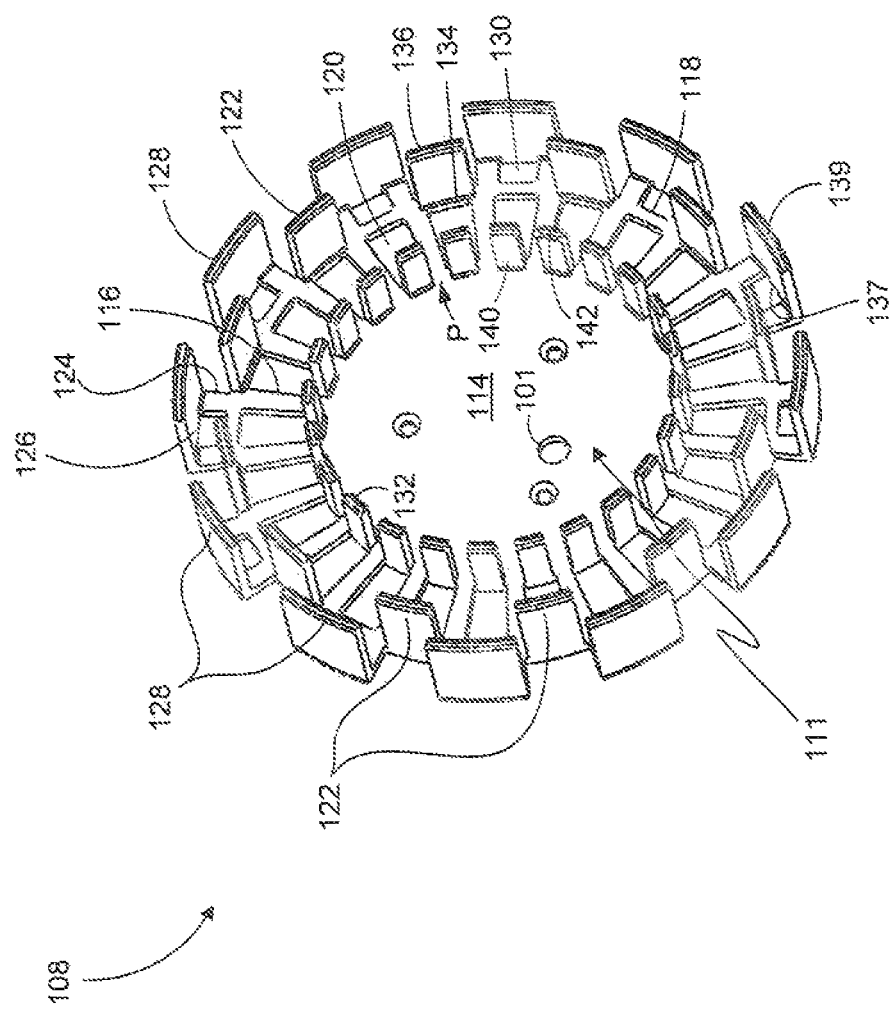
FIG. 4 illustrates a top perspective view of one embodiment of a heat sink consistent with the present disclosure.
Figure 5:
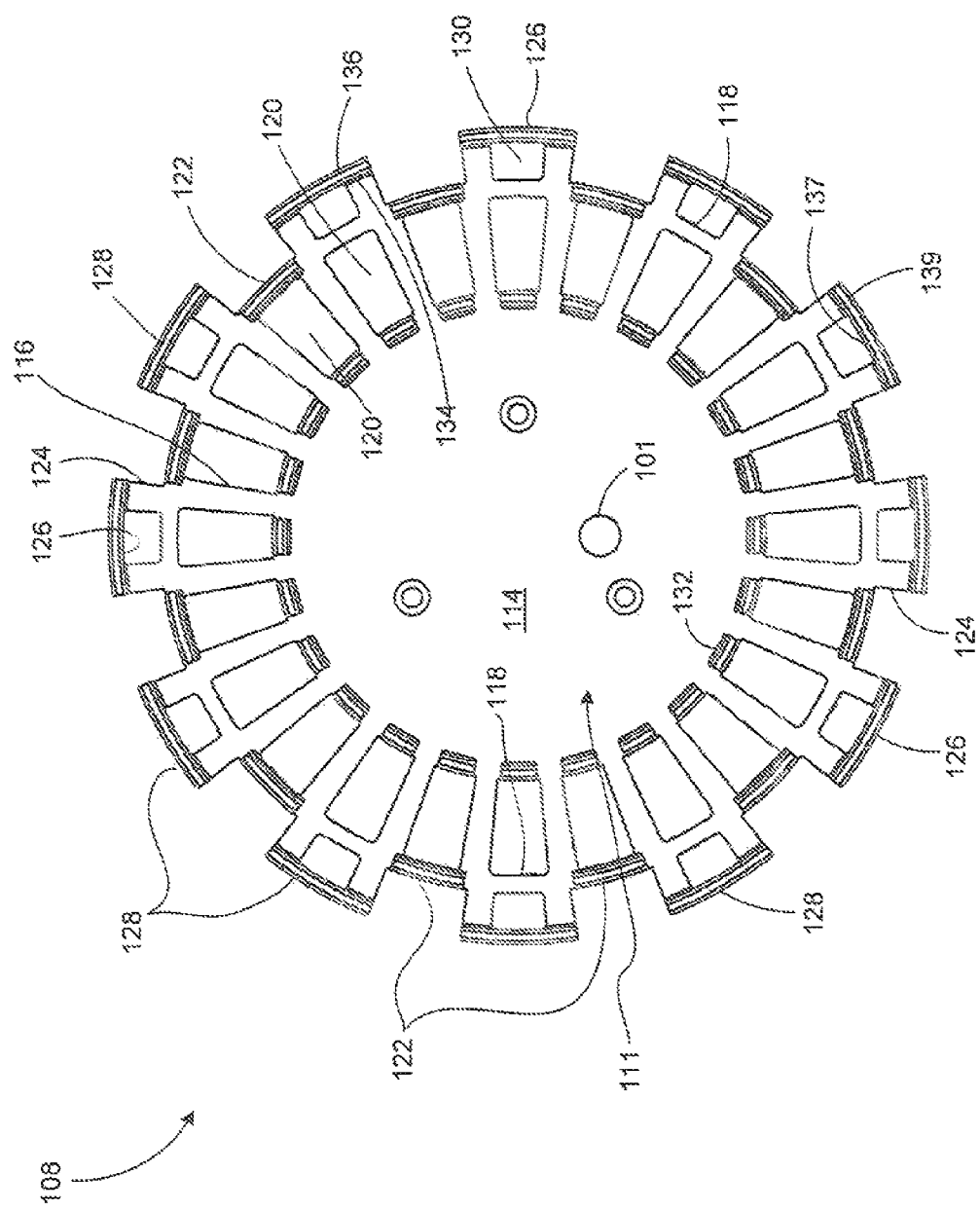
FIG. 5 illustrates a top plan view of the heat sink of FIG. 4.
Figure 6:
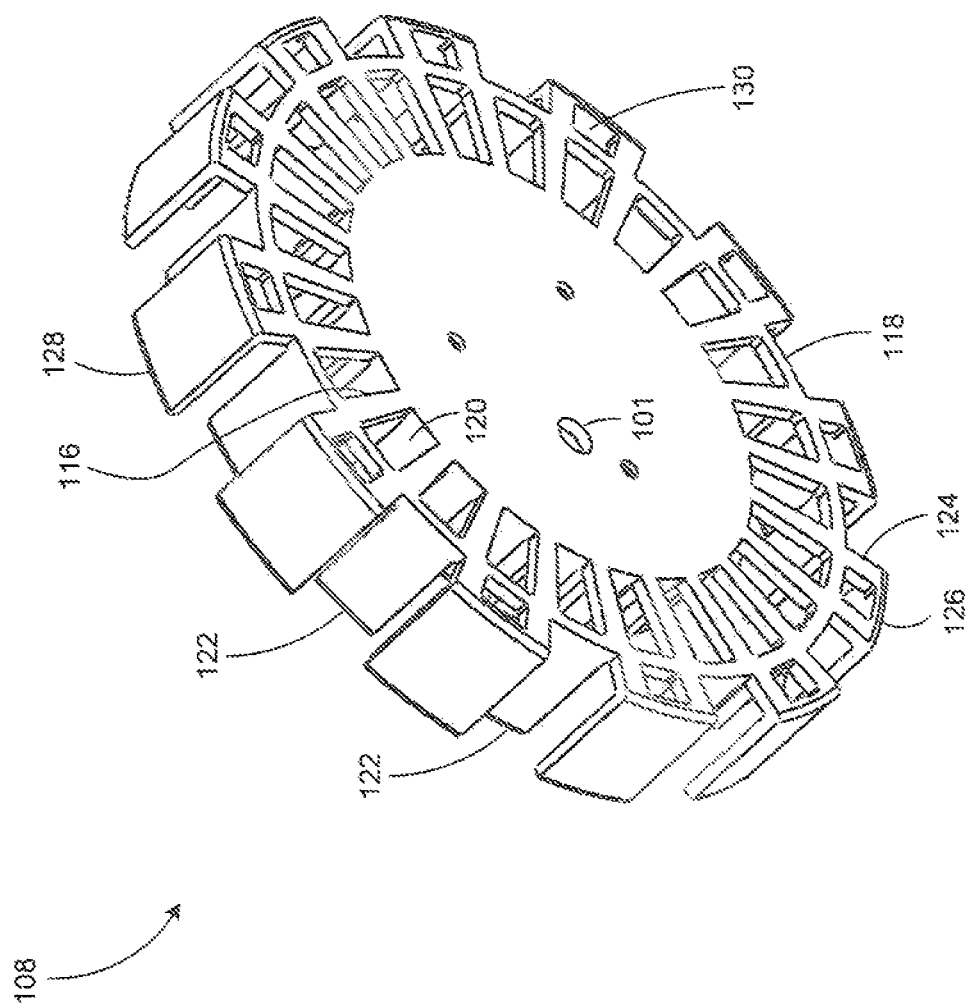
FIG. 6 illustrates a bottom perspective view of the heat sink of FIG. 4.
Figure 7:
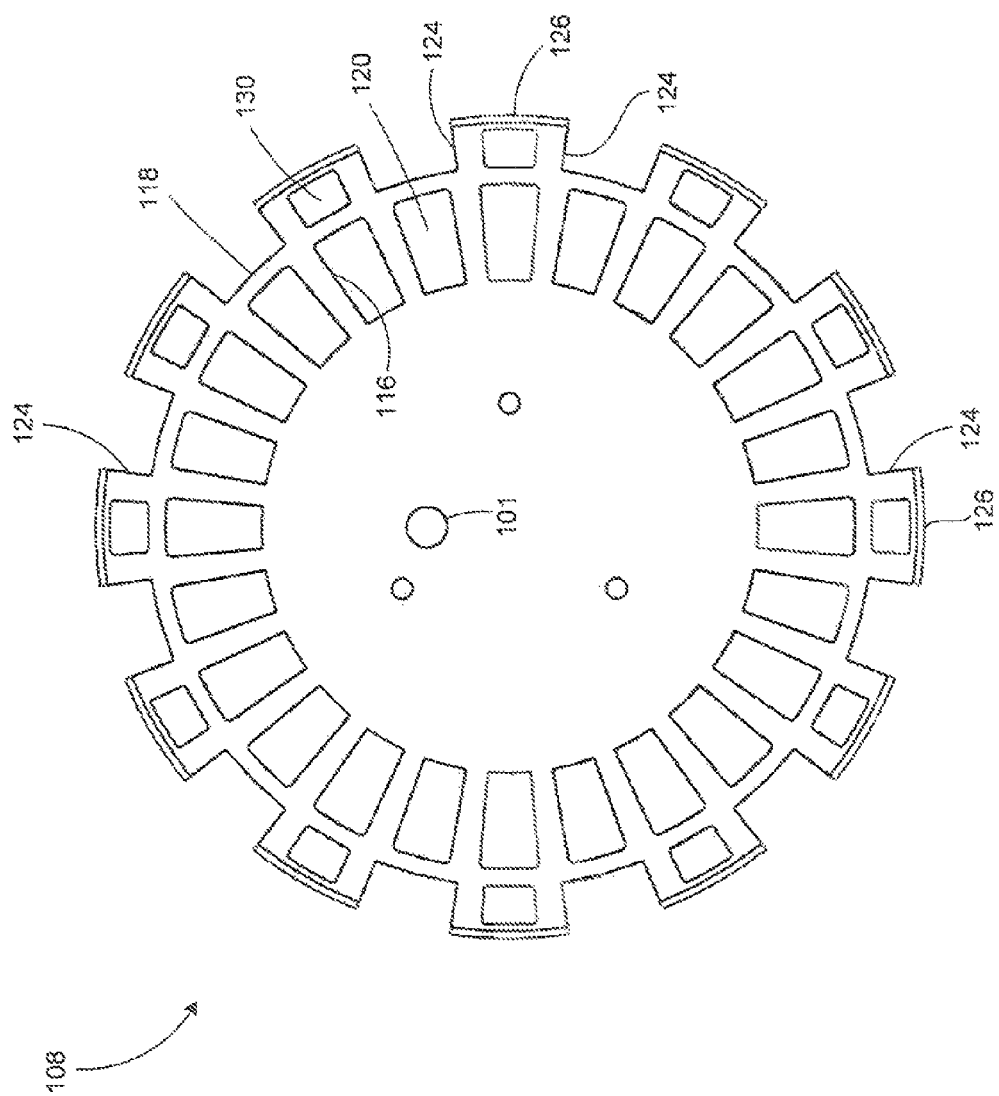
FIG. 7 illustrates a bottom plan view of the heat sink of FIG. 4.
Figure 8:
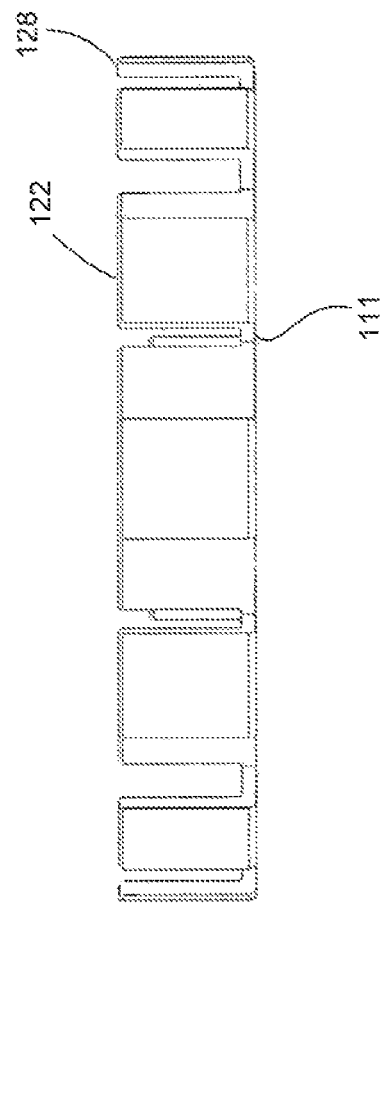
FIG. 8 illustrates a side view of the heat sink of FIG. 4.

With reference to FIGS. 4-8, various views of one embodiment of a heat sink 108 consistent with the present disclosure are generally illustrated. In particular, FIG. 4 illustrates a top perspective view of the heat sink 108, FIG. 5 illustrates a top plan view of the heat sink 108, FIG. 6 illustrates a bottom perspective view of the heat sink 108, FIG. 7 illustrates a bottom plan view of the heat sink 108, and FIG. 8 illustrates a side view of the heat sink 108.

The heat sink 108 includes a base portion 111 including a central light module receiving region 114, a first set of first arms 116, a first set of first transverse members 118, a first set of first air flow apertures 120, and a first set of first radiating plates 122. The heat sink 108 may optionally include additional sets of arms, transverse members, air flow apertures, and/or radiating plates. For example, as best shown in FIGS. 5-7, the heat sink 108 may include any combination of a second set of second arms 124, a second set of second transverse members 126, a second set of second radiating plates 128, a second set of second air flow apertures 130, and/or a third set of radiating plates 132. It should be appreciated that a heat sink 108 consistent with the present disclosure is not limited to the specific configuration of arms, transverse members, air flow apertures, and/or radiating plates as generally illustrated unless specifically claimed as such and that other configurations of arms, transverse members, air flow apertures, and/or radiating plates consistent with the present disclosure are considered within the scope of this disclosure. The number, size, and/or shape of the arms, transverse members, air flow apertures, and/or radiating plates will depend on the lamp's form factor and size, and is therefore application specific.

As noted above, the central light module receiving region 114 is configured to receive at least a portion of the light module 102 such that thermal energy generated by the light module 102 is transferred to the heat sink 108, and ultimately to the surrounding atmosphere. Heat transferred to the central light module receiving region 114 is transferred through the first set of first arms 116, the first set of first transverse members 118, and the first set of first radiating plates 122 to the surrounding atmosphere. The first set of first air flow apertures 120 are configured to provide air flow across the surfaces of the heat sink 108, thereby increasing the efficiency and the amount of thermal energy transferred to the atmosphere. As noted above, additional arms, transverse members, air flow apertures, and/or radiating plates may be provided depending on the amount of thermal energy needed to be dissipated. The specific configuration of the heat sink 108 will therefore depend on the intended application.

The first set of first arms 116 extend generally radially outwardly from a portion, such as a perimeter P, of the light module receiving region 114. The first set of first transverse members 118 intersect with the first set of first arms 116. According to one embodiment, each of the first set of first transverse members 118 intersects with a different pair of adjacent arms 116 a radial distance from the light module receiving region 114. In the illustrated embodiment, all of the first set of first transverse members 118 are shown spaced the same radial distance from the light module receiving region 114 such that the first set of first transverse members 118 generally form a first ring. It should be appreciated, however, that one or more of the first set of first transverse members 118 may be spaced at different radial distances from the light module receiving region 114.

The first set of first air flow apertures 120 are defined by the base portion 111, the first set of arms 116, and the first set of transverse members 118. One or more of the first set of first air flow apertures 120 may be formed by removing a portion of the sheet material as explained herein. Alternatively (or in addition), one or more of the first set of first air flow apertures 120 may be formed by stamping and bending a portion of the sheet material to form a radiating plate (e.g., but not limited to, one of the first and/or third sets of radiating plates 122, 132). While the first set of first air flow apertures 120 are illustrated having a generally rectangular cross-section, it should be understood that this is not a limitation of the present disclosure unless specifically claimed as such and that one or more of the first set of first air flow apertures 120 may have any shape such as, but not limited to, circular, triangular, oval, or the like.

Figure 9:
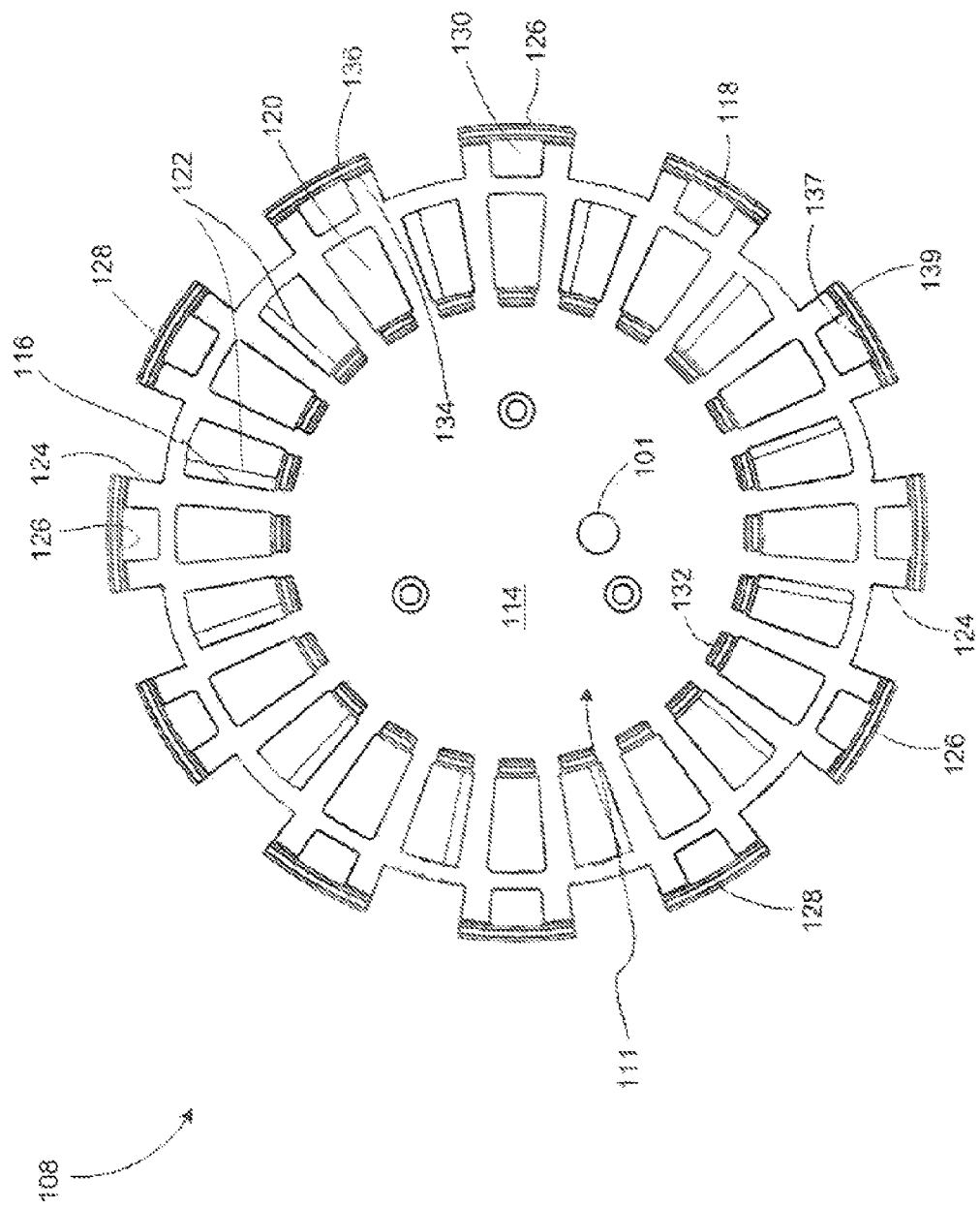
FIG. 9 illustrates a top plan view of another embodiment of a heat sink consistent with the present disclosure.

The first set of first radiating plates 122 are bent outwardly and extend transversely from a front face of a respective first arm 116 or first transverse member 118. Each of the first set of first radiating plates 122 is separated from adjacent radiating plates by a gap (here, approximately the angular extent of transverse member 118) which permits airflow between adjacent radiating plates. According to one embodiment, at least one of the first set of first radiating plates 122 includes a first edge 134 and at least one unsupported edge 136. The first edge 134 is coupled to the front face of at least one of the first set of arms 116 (as shown in FIG. 9) or the first set of transverse members 118 (as shown in FIG. 4). As used herein, the front face of the arms 116 or transverse members 118 is defined when looking at the heat sink from the central light module receiving region (i.e., when viewed from the perspective of FIG. 5). The second edge 136 is therefore exposed to the atmosphere. According to one embodiment, at least one of the first set of first radiating plates 122 has a shape substantially corresponding to the shape of one of the first set of first air flow apertures 120. As illustrated in FIG. 4, each radiating plate 122 has three free, unsupported edges. Optionally radiating plates 122 could be in a triangular shape, having two free edges 136 or semi-circular having one free edged 136.

While the first set of first radiating plates 122 are illustrated extending from the first set of transverse members 118, it should be appreciated that one or more of the first set of first radiating plates 122 may also (or alternatively) extend from one or more of the first set of arms 116. Additionally, while the first set of first radiating plates 122 are illustrated as being arranged the same radial distance from the base 111 (i.e., the first set of first radiating plates 122 form a ring) and are generally concentric with the first ring defined by the first transverse members 118, it should be appreciated that one or more of the first set of first radiating plates 122 may be spaced a different radial distance from the base 111.

As noted above, the heat sink 108 may optionally include any combination of a second set of second arms 124, a second set of second transverse members 126, a second set of second radiating plates 128, a second set of second air flow apertures 130, and/or a third set of radiating plates 132. The second set of second arms 124 extend generally radially outwardly from at least one of the first set of arms 116 and the first set of transverse members 118. The second set of second transverse members 126 intersect with the second set of arms 124. Optionally, the first and the second sets of transverse members 118, 126 are arranged to form a first and a second concentric ring, respectively.

The second set of second radiating plates 128 are bent outwardly and extend transversely from a front face of at least one of the second set arms 124 or second transverse member 126. Each of the second set of second radiating plates 128 is separated from adjacent radiating plates by a gap (here, the angular extent of the adjacent arms 124) which permits airflow between adjacent radiating plates. Optionally, the first and the second sets of second radiating plates 120, 128 may be aligned with the first and the second concentric ring, respectively. According to one embodiment, at least one of the second set of second radiating plates 128 includes a first edge 137 and at least one unsupported edge 139. The first edge 137 is coupled to the front face of the second set of arms 124 or transverse members 126. The second edge 139 is therefore exposed to the atmosphere.

The second set of second air flow apertures 130 are defined by the first set of transverse members 118, the second set of arms 124, and the second set of transverse members 126. One or more of the second set of second air flow apertures 130 may be formed by removing a portion of the sheet material as explained herein. Alternatively (or in addition), one or more of the second set of second air flow apertures 130 may be formed by stamping and bending a portion of the sheet material to form a radiating plate (e.g., but not limited to, one of the first and/or second sets of radiating plates 122, 128). While the second set of second air flow apertures 130 are illustrated having a generally rectangular cross-section, it should be understood that this is not a limitation of the present disclosure unless specifically claimed as such and that one or more of the second set of second air flow apertures 130 may have any shape such as, but not limited to, circular, triangular, oval, or the like. According to one embodiment, at least one of the second set of second air flow apertures 130 has a shape substantially corresponding to the shape of one of the first or second sets of radiating plates 122, 128.

Optionally, the heat sink 108 may include a third set of radiating plates 132. The third set of radiating plates 132 may extend generally longitudinally outwardly from a portion, such as the perimeter P, of the light module receiving region 114. As used herein, the term "longitudinally" is intended to refer to an axis of the light system 100 generally aligned with the length of the light system 100, for example, extending generally outwardly from the page as shown in FIGS. 5 and 7. Alternatively, one or more of the third set of radiating plates 132 may extend generally longitudinally outwardly from the first set of first arms 116.

Each of the third set of radiating plates 132 is separated from adjacent radiating plates by a gap which permits airflow between adjacent radiating plates. According to one embodiment, at least one of the third set of radiating plates 132 includes a first edge 140 and at least one unsupported edge 142. The first edge 140 is coupled to the front face of the perimeter P of the light module receiving region 114, as shown in FIG. 4, or at least one the first set of arms 116. The second unsupported edge 142 is therefore exposed to the atmosphere. According to one embodiment, at least one of the third set of radiating plates 132 has a shape substantially corresponding to the shape of one of the first set of first air flow apertures 120.

According to one embodiment, the third set of radiating plates 132 may be configured to transfer thermal energy directly form the light module 102, rather than through the central light module receiving region 114. For example, at least a portion of the third set of radiating plates 132 may abut against the central light module receiving region 114 (though it should be appreciated that a thermal pad may also be provided). The third set of radiating plates 132 may also be used to secure the light module 102 to the heat sink 108, for example, using an interference connection, fasteners, adhesives, or the like.

Turning now to FIGS. 10 and 11, one embodiment showing a sheet of material prior to the heat sink 108 being formed (FIG. 10) and after formed (FIG. 11) are generally illustrated. More specifically, FIG. 10 generally illustrates a generally planar sheet of material 200 in which the sheet 200 has been stamped or cut to form a pattern which will ultimately be used to create the heat sink 108. In particular, the sheet 200 includes a first set of cuts 202 which are bent from the perimeter P to form the third set of radiating plates 132, the first set of arms 116, the first set of transverse members 118, and the first set of air flow apertures 120. The sheet 200 also includes cutouts 204 which form the second set of air flow apertures 130. It should be noted, however, that rather than cutting out and discarding a portion of the sheet 200 to form the second set of air flow apertures 130, the sheet 200 may alternatively be stamped and bent to form a radiating plate and an air flow aperture.

The sheet 200 may also be cut (for example, along cut lines 206, 208) and/or bent (for example, as generally illustrated by dotted lines 210 and 212) to form the first and second sets of radiating plates 122, 128, respectively, as well as the second set of arms 124, and the second set of transverse members 126. Again, it should be appreciated that the present disclosure is not limited to the embodiments illustrated in FIGS. 10 and 11, and that a heat sink 108 consistent with the present disclosure may include other embodiments. It should also be understood that the sheet 200 may be cut in a single operation or multiple operations, and that the bends may be formed in single operation or multiple operations.

Figure 12:
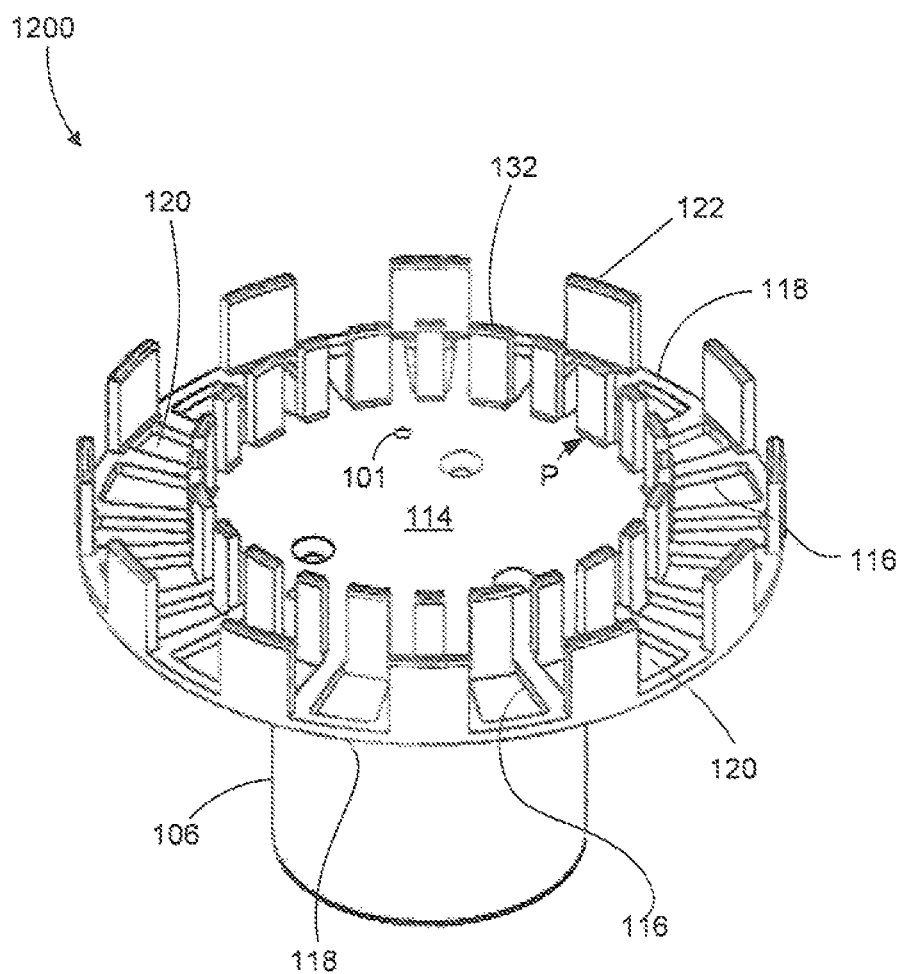
FIG. 12 illustrates another embodiment of a heat sink consistent with the present disclosure.
Figure 13:
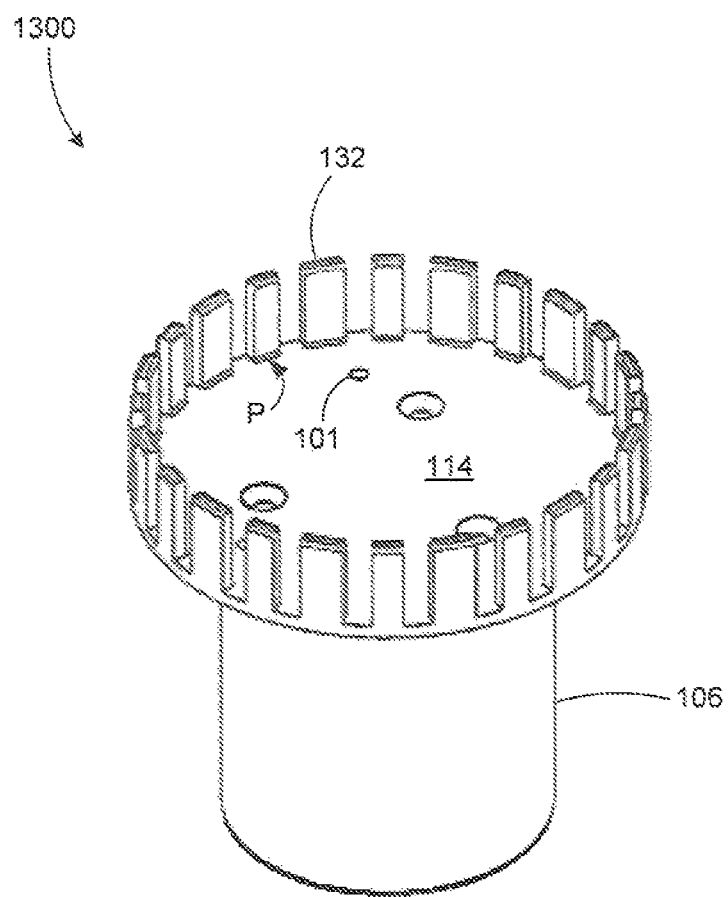
FIG. 13 illustrates yet another embodiment of a heat sink consistent with the present disclosure.

In addition, the same basic stamping technique used to form the heat sink 108 illustrated in FIG. 11 may also be generally used to make other heat sinks with only minor or minimal changes. For example, the heat sink 108 illustrated in FIG. 11 may generally correspond to a PAR38 heat sink (i.e., the heat sink 108 may be used to form a light system 100 designed to fit with in a standard PAR38 configuration). With reference to FIGS. 12 and 13, the same basic heat sink may be modified to make a PAR30 and/or a PAR20 compatible heat sink 1200, 1300, respectively. More specifically, starting with the PAR38 heat sink 108, the second set of arms 124, transverse members 126, and radiating plates 128 may be removed (or not stamped) to form a heat sink 100 having overall dimensions compatible with a PAR30 application. Additionally, the first set of arms 116, first set of transverse members 118, and the first set of radiating plates 120 may be removed (or not stamped) from the PAR30 heat sink 100 to form a heat sink 1200 having overall dimensions compatible with a PAR20 application.

The configuration of the PAR38 heat sink 108 may therefore be designed such that the heat sink 108 has satisfactory thermal performance for its intended application and may be further designed such that the resulting PAR30 and PAR20 applications also function for their intended applications. Specifically, the heat sink may be designed to work in its smallest application (e.g., PAR20 and/or PAR30), and additional radiating plates, arms, transverse members, and air flow apertures may be added to form the larger heat sinks (e.g., PAR30 and/or PAR38). Accordingly, the manufacturing costs may be reduced by allowing the same basic stamping technique to be used to manufacture two or more heat sinks for different applications.

While the radiating plates 122, 128, 132 are illustrated extending outwardly at approximately a 90 degree angle, it should be appreciated that one or more of the radiating plates 122, 128, 132 may be arranged at an angle greater than or less than 90 degrees such as, but not limited to, between 45 and 135 degrees. In addition, while the base 111, arms 116, 124, and transverse members 118, 126 are illustrated as being planar and extending within the same plane, it should be appreciated that one or more of the base 111, arms 116, 124, and transverse members 118, 126 may be non-planar. For example, one or more of the base 111, arms 116, 124, and transverse members 118, 126 may have a curvature.

As used in any embodiment herein, "circuitry" may comprise, for example, singly or in any combination, hardwired circuitry, programmable circuitry, state machine circuitry, and/or firmware that stores instructions executed by programmable circuitry. In at least one embodiment, the light module 102 and/or the electrical module 104 may include a controller, photodetector, PWM circuitry and/or driver circuitry configured to convert an AC signal into a DC signal at a desired current and voltage, and/or generate one or more control signals to adjust the operation of the light module 102, for example, the brightness (e.g., a dimmer circuitry) of the LEDs, color of the light emitted from the LEDs (e.g., the light module 102 may include two or more LEDs configured to emit light having different wavelengths, wherein the driver circuitry may adjust the relative brightness of the different LEDs in order to change the mixed color from the light system 100, adjust for changes in ambient lighting conditions (e.g., an ambient light sensor), adjust for temperature changes, adjust for changes in output due to lifetime changes, and the like. The controller, photodetector, PWM circuitry and/or driver circuitry may collectively or individually comprise one or more integrated circuits. An "integrated circuit" may be a digital, analog or mixed-signal semiconductor device and/or microelectronic device, such as, for example, but not limited to, a semiconductor integrated circuit chip.

While several embodiments of the present disclosure have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present disclosure. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present disclosure is/are used. Those skilled in the art will recognize, or be able to ascertain using no more than routine experimentation, many equivalents to the specific embodiments of the disclosure described herein. It is, therefore, to be understood that the foregoing embodiments are presented by way of example only and that, within the scope of the appended claims and equivalents thereto, the disclosure may be practiced otherwise than as specifically described and claimed. The present disclosure is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present disclosure.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified, unless clearly indicated to the contrary.

The following is a non-limiting list of reference numerals used in the specification:
    100 light system;
    101 passageway;
    102 light module;
    104 electrical module;
    105 electrical connector;
    106 driver housing;
    108 heat sink;
    110 open end;
    111 base;
    112 closed end;
    114 central light module receiving region;
    116 first set of first arms;
    118 first set of first transverse members;
    120 first set of first air flow apertures;
    122 first set of first radiating plates;
    124 second set of second arms;
    126 second set of second transverse members;
    128 second set of second radiating plates;
    130 second set of second air flow apertures;
    132 third set of radiating plates;
    134 first edge;

136 unsupported edge;
137 first edge;
139 unsupported edge;
140 first edge;
142 unsupported edge;
200 sheet;
202 set of cuts;
204 cutouts;
206 cut lines;
208 cut lines;
210 bends;
212 bends;
214 unsupported edge;
P perimeter;

What is claimed is:

1. A solid state lighting device (100) comprising:
a heat sink (108) stamped from a single sheet (200) of thermally conductive material, said heat sink (108) comprising:
a base portion (111) including a central light module receiving region (114) configured to receive a light module (102);
a first set of first arms (116) extending generally radially outwardly from said base (111);
a first set of first transverse members (118) intersecting with said first set of arms (116);
a first set of first air flow apertures (120) defined by said base portion (111), said first set of arms (116), and said first set of transverse members (118); and
a first set of first radiating plates (122) having adjacent pairs of radiating plates separated by gaps thereby permitting airflow between said adjacent pairs, wherein each one of said first set of radiating plates (122) is bent outwardly and extends transversely from a front face of a respective first arm (116) or first transverse member (118).

2. The solid state lighting device (100) of claim 1, wherein each transverse member (118) intersects with a different pair of adjacent radial arms (116) a radial distance from said light module receiving region (114).

3. The solid state lighting device (100) of claim 1, wherein at least one of said first set of radiating plates (122) includes a first edge (134) and at least one unsupported edge (136), wherein said first edge (134) is coupled to front faces of at least one of said first set of arms (116) or first set of transverse members (118).

4. The solid state lighting device (100) of claim 1, wherein at least one of said first set of radiating plates (122) comprises a shape substantially corresponding to a shape of one of said first set of air flow apertures (120).

5. The solid state lighting device (100) of claim 1, wherein said first set of transverse members (118) defines a first ring.

6. The solid state lighting device (100) of claim 5, wherein said first set of radiating plates (122) extends outwardly from said first set of transverse members (118) generally concentric with said first ring.

7. The solid state lighting device (100) of claim 1, wherein said heat sink 108 further comprises:
a second set of second arms (124) extending generally radially outwardly from at least one of said first set of arms (116) and said first set of transverse members (118);
a second set of second transverse members (126) intersecting with said second set of arms (124) a radial distance from said first set of transverse members (118); and
a second set of second radiating plates (128) bent outwardly and extending transversely from front faces of at least one of said second set of arms (124) or said second set of transverse members (126), wherein adjacent pairs of said second set of radiating plates (128) are separated by air gaps thereby permitting airflow between said adjacent pairs of said second set of radiating plates (128).

8. The solid state lighting device (100) of claim 7, wherein said first set and said second set of transverse members (126) define a first and a second concentric ring, respectively.

9. The solid state lighting device (100) of claim 8, wherein said first set and said second set of radiating plates (122, 128) are generally aligned in said first and said second concentric ring, respectively.

10. The solid state lighting device (100) of claim 7, further comprising a second set of air flow apertures (130) defined by said first set of transverse members (118), said second set of transverse members (126), and said second set of arms (124).

11. The solid state lighting device (100) of claim 10, wherein at least one of said second set of radiating plates (128) comprises a shape substantially corresponding to a shape of one of said second set of air flow apertures (130).

12. The solid state lighting device (100) of claim 1, wherein said base (111) defines a radially outwardly directed perimeter (P), and said heat sink (108) further comprises a third set of radiating plates (132) extending generally longitudinally outwardly from said perimeter (P) of said light module receiving region (114).

13. The solid state lighting device (100) of claim 12, wherein at least one of said third set of radiating plates (132) comprises a shape substantially corresponding to a shape of one of said first set of air flow apertures (120).

14. The solid state lighting device (100) of claim 1, wherein said central light module receiving region (114), said first set of arms (116), and said first set of transverse members (118) are generally coplanar.

15. The solid state lighting device (100) of claim 1, further comprising said light module (102).

* * * * *